(12) United States Patent
Ishii et al.

(10) Patent No.: US 10,319,444 B2
(45) Date of Patent: Jun. 11, 2019

(54) MEMORY DATA RANDOMIZER

(71) Applicant: INTERNATIONAL BUSINESS MACHINES CORPORATION, Armonk, NY (US)

(72) Inventors: Masatoshi Ishii, Yokohama (JP); Nobuyuki Ohba, Sendai (JP); Atsuya Okazaki, Setagaya (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/797,002

(22) Filed: Oct. 30, 2017

(65) Prior Publication Data

US 2019/0130977 A1    May 2, 2019

(51) Int. Cl.
| | |
|---|---|
| *G11C 5/14* | (2006.01) |
| *G11C 16/08* | (2006.01) |
| *G11C 16/16* | (2006.01) |
| *G11C 11/54* | (2006.01) |
| *G11C 16/10* | (2006.01) |

(52) U.S. Cl.
CPC .............. *G11C 16/08* (2013.01); *G11C 11/54* (2013.01); *G11C 16/10* (2013.01); *G11C 16/16* (2013.01)

(58) Field of Classification Search
CPC ...... G11C 5/147; G11C 5/145; G11C 11/4074
USPC .............. 365/189.09, 210.12; 706/15, 34
See application file for complete search history.

(56) References Cited

U.S. PATENT DOCUMENTS

| | | | |
|---|---|---|---|
| 8,930,291 B1* | 1/2015 | Srinivasa | G06N 3/063 706/15 |
| 2006/0284657 A1* | 12/2006 | Park | H03K 3/0315 327/156 |
| 2008/0151618 A1 | 6/2008 | Sharon et al. | |
| 2009/0067244 A1 | 3/2009 | Li et al. | |
| 2014/0215126 A1 | 7/2014 | Avila et al. | |

\* cited by examiner

*Primary Examiner* — Jason Lappas
(74) *Attorney, Agent, or Firm* — Tutunjian & Bitetto, P.C.; Vazken Alexanian

(57) ABSTRACT

A method is provided of initializing a chip having synaptic NVRAM cells connected row-wise by word lines and column-wise by bit lines. The method includes selecting each word line through a row decoder connected to all word lines to switch all synaptic NVRAM cells of the selected lines. The method includes driving, on the selected lines, a wave generated by a PLL circuit connected to the row decoder. The method includes generating standing waves from the wave on the selected lines by implementing a resonance detection point at an input end of each word line. The method includes applying a write voltage on all bit lines through a column decoder connected to all bit lines. The method includes simultaneously driving each of the synaptic NVRAM cells of the selected lines by different writing currents for different durations in order to set different analog values to the synaptic NVRAM cells.

11 Claims, 8 Drawing Sheets

MEMORY DATA RANDOMIZER

BACKGROUND

Technical Field

The present invention relates generally to memory devices and, in particular, to a memory data randomizer.

Description of the Related Art

Non-Volatile Random Access Memory (NVRAM) is used as an analog memory device for cognitive systems. To obtain stochastic behaviors in neural networks, it is desirable to add a random offset to data. Accordingly, cells of a NVRAM should have random values on a reset. Hence, there is a need for a memory data randomizer capable of adding random values to cells of a NVRAM on a reset.

SUMMARY

According to an aspect of the present invention, a method is provided of initializing a chip having synaptic Non-Volatile Random Access Memory (NVRAM) cells connected row-wise by word lines and column-wise by bit lines. The method includes selecting each of the word lines through a row decoder connected to all of the word lines to switch all of the synaptic NVRAM cells of the selected word lines. The method further includes driving, on the selected word lines, a wave generated by a Phase Locked Loop (PLL) circuit connected to the row decoder. The method also includes generating standing waves from the wave on the selected word lines by implementing a resonance detection point at an input end of each the word lines. The method additionally includes applying a write voltage on all of the bit lines through a column decoder connected to all of the bit lines. The method further includes simultaneously driving each of the synaptic NVRAM cells of the selected word lines by different writing currents for different durations in order to set different analog values to all of the synaptic NVRAM cells.

According to another aspect of the present invention, a computer program product is provided for initializing a chip having synaptic Non-Volatile Random Access Memory (NVRAM) cells connected row-wise by word lines and column-wise by bit lines. The computer program product includes a non-transitory computer readable storage medium having program instructions embodied therewith. The program instructions are executable by a computer to cause the computer to perform a method. The method includes selecting each of the word lines through a row decoder connected to all of the word lines to switch all of the synaptic NVRAM cells of the selected word lines. The method further includes driving, on the selected word lines, a wave generated by a Phase Locked Loop (PLL) circuit connected to the row decoder. The method also includes generating standing waves from the wave on the selected word lines by implementing a resonance detection point at an input end of each the word lines. The method additionally includes applying a write voltage on all of the bit lines through a column decoder connected to all of the bit lines. The method further includes simultaneously driving each of the synaptic NVRAM cells of the selected word lines by different writing currents for different durations in order to set different analog values to all of the synaptic NVRAM cells.

According to yet another aspect of the present invention, a system is provided for initializing a chip having synaptic Non-Volatile Random Access Memory (NVRAM) cells connected row-wise by word lines and column-wise by bit lines. The system includes a column decoder connected to all of the bit lines. The system further includes a row decoder, connected to all of the word lines, for selecting each of the word lines to switch all of the synaptic NVRAM cells of the selected word lines. The system also includes a Phase Locked Loop (PLL) circuit connected to the row decoder for driving a wave on the selected word lines. The system additionally includes a resonance detection point implemented at an input end of each the word lines to generate standing waves from the wave on the selected word lines. The system further includes a switch for applying a write voltage on all of the bit lines through the column decoder, Each of the synaptic NVRAM cells of the selected word lines is simultaneously driven by different writing currents for different durations in order to set different analog values to all of the synaptic NVRAM cells.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The present invention is directed to a memory data randomizer.

In an embodiment, the present invention provides a hardware scheme that (1) adds random offset to the data and (2) quickly initializes NVRAM cells with different values.

In an embodiment, the present invention can drive a word line by a high-frequency wave. In an embodiment, the present invention can make a standing wave on the word line. In an embodiment, the present invention can drive multiple cells by different currents for a different period of time in order to set different values to each cell. These and other features of the present invention will be described in further detail herein below.

Figure 1:
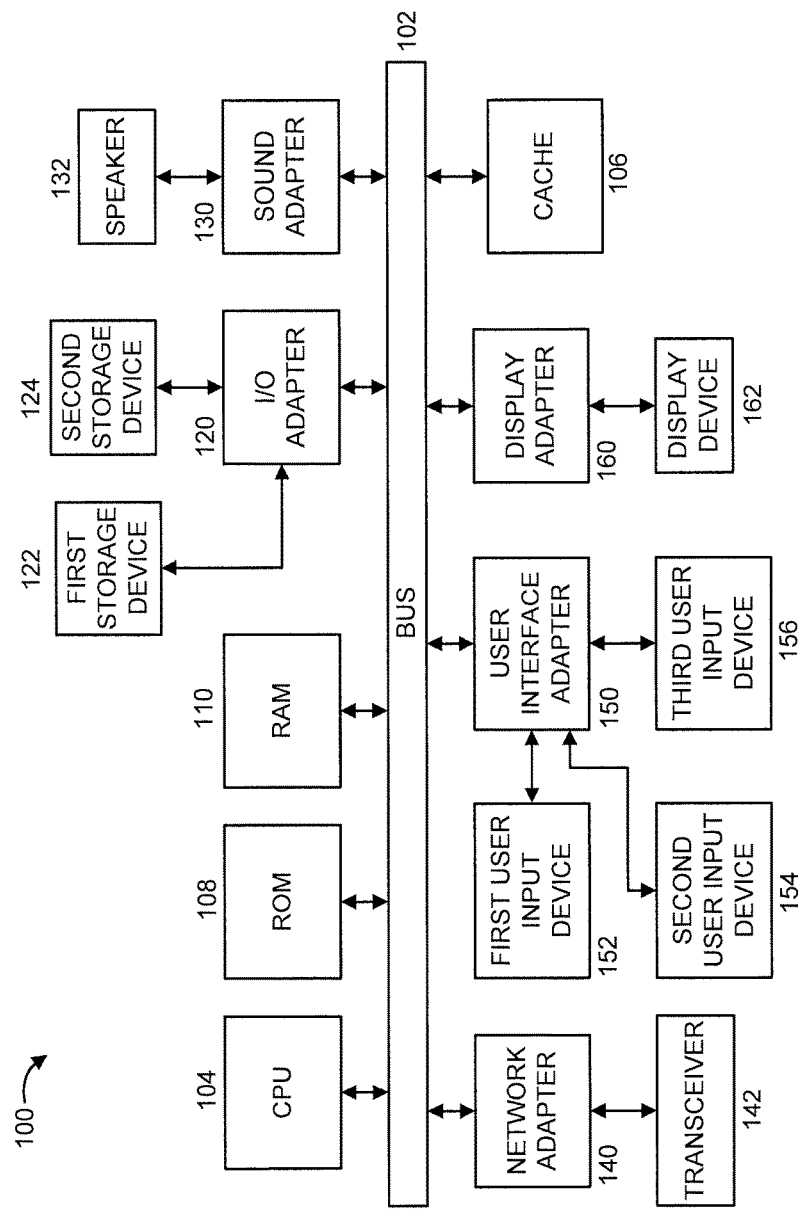
FIG. 1 shows an exemplary processing system to which the present invention may be applied, in accordance with an embodiment of the present invention.

FIG. 1 shows an exemplary processing system 100 to which the invention principles may be applied, in accordance with an embodiment of the present invention. The processing system 100 includes at least one processor (CPU) 104 operatively coupled to other components via a system bus 102. A cache 106, a Read Only Memory (ROM) 108, a Random Access Memory (RAM) 110, an input/output (I/O) adapter 120, a sound adapter 130, a network adapter 140, a user interface adapter 150, and a display adapter 160, are operatively coupled to the system bus 102. At least one Graphics Processing Unit (GPU) 194 is operatively coupled to the system bus 102.

A first storage device 122 and a second storage device 124 are operatively coupled to system bus 102 by the I/O adapter 120. The storage devices 122 and 124 can be any of a disk storage device (e.g., a magnetic or optical disk storage device), a solid state magnetic device, and so forth. The storage devices 122 and 124 can be the same type of storage device or different types of storage devices.

A speaker 132 is operatively coupled to system bus 102 by the sound adapter 130. A transceiver 142 is operatively coupled to system bus 102 by network adapter 140. A display device 162 is operatively coupled to system bus 102 by display adapter 160.

A first user input device 152, a second user input device 154, and a third user input device 156 are operatively coupled to system bus 102 by user interface adapter 150. The user input devices 152, 154, and 156 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present invention. The user input devices 152, 154, and 156 can be the same type of user input device or different types of user input devices. The user input devices 152, 154, and 156 are used to input and output information to and from system 100.

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 100 are readily contemplated by one of ordinary skill in the art given the teachings of the present invention provided herein.

Figure 2:
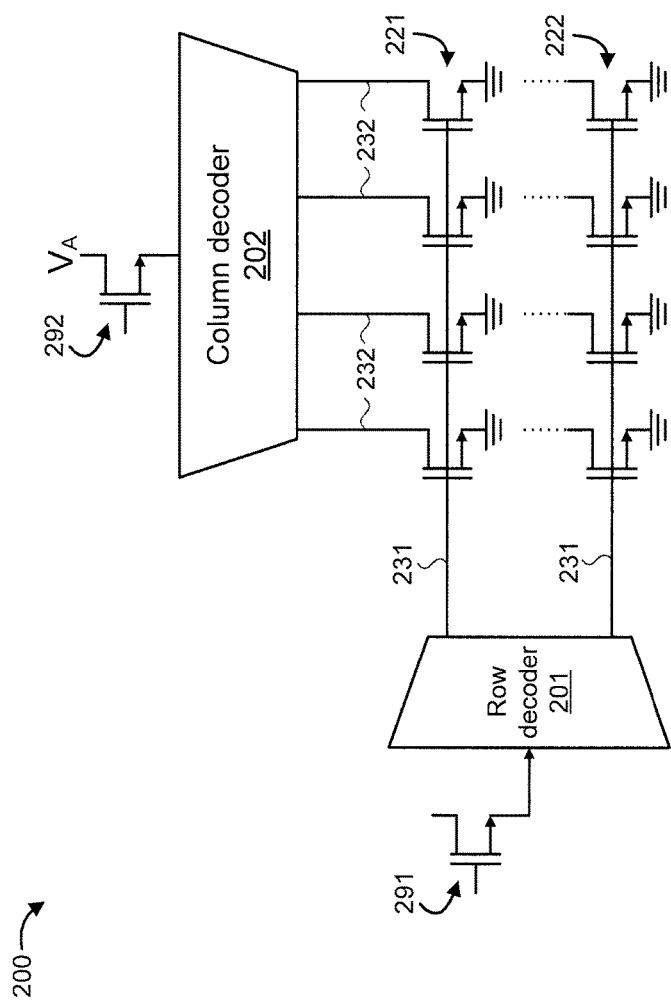
FIG. 2 shows an exemplary simplified NVRAM architecture to which the present invention can be applied, in accordance with an embodiment of the present invention.

FIG. 2 shows an exemplary simplified NVRAM architecture 200 to which the present invention can be applied, in accordance with an embodiment of the present invention.

The NVRAM architecture 200 includes a row decoder 201, a column decoder 202, a first row of N-channel enhancement mode Metal Oxide Semiconductor Field Effect Transistors (MOSFETs) 221, a second row of N-channel enhancement mode MOSFETs 222, an N-channel enhancement mode MOSFET 291 and an N-channel enhancement mode MOSFET 292. The NVRAM architecture further includes word lines 231 and bit lines 232.

The MOSFET 291 is used to control the row decoder 201, and the MOSFET 292 is used to control the column decoder 202, where such control can involve row and column selection, respectively.

It is to be appreciated that the use of a memory architecture having two rows and four columns as shown in the NVRAM architecture 200 of FIG. 2 is merely illustrative and that other embodiments of the present invention can involve memory architectures having other numbers of rows and columns. It is to be further appreciated that the present invention can be applied to others memory architectures and configurations. These and other variations of a memory device to which the present invention can be applied are readily determined by one of ordinary skill in the art, given the teachings of the present invention provided herein, while maintaining the spirit of the present invention.

Various modes of a memory device being used in accordance with the teachings of one or more embodiments of the present invention will be described hereinafter with respect to FIGS. 3-6, with such memory device involving a similar architecture to that shown and described with respect to FIG. 2 for the sake of illustration. The memory device in FIGS. 3-6 can be the same memory device, with different elements and connections applicable and shown depending upon the current mode applied to the memory device, as readily appreciated by one of ordinary skill in the art. For example, in the case of FIG. 6, additional bias elements can be added or involved in the memory device in order to provide the bias described with respect to FIG. 6.

While one or more embodiments of the present invention are shown and described with respect to N-channel enhancement mode MOSFETs, the present invention is not limited to the same. Thus, other embodiments of the present invention can use other types of transistors, as readily appreciated by one of ordinary skill in the art, while maintaining the spirit of the present invention.

In an embodiment, the memory device can be implemented in a chip (e.g., an Application Specific Integrated Circuit (ASIC), a three-dimension (3D) chip stack, and so forth). In an embodiment, the chip can be a neuromorphic chip. In an embodiment, the neurotrophic chip can have multiple synaptic Non-Volatile Random Access Memory (NVRAM) cells. In an embodiment, the cells can be interconnected row-wise by word-lines and column-wise by bit-lines (or vice-versa) to form a neuromorphic chip as a synaptic cell array. These and other types of chips and/or cell arrangements can also be used, while maintaining the spirit of the present invention.

Figure 3:
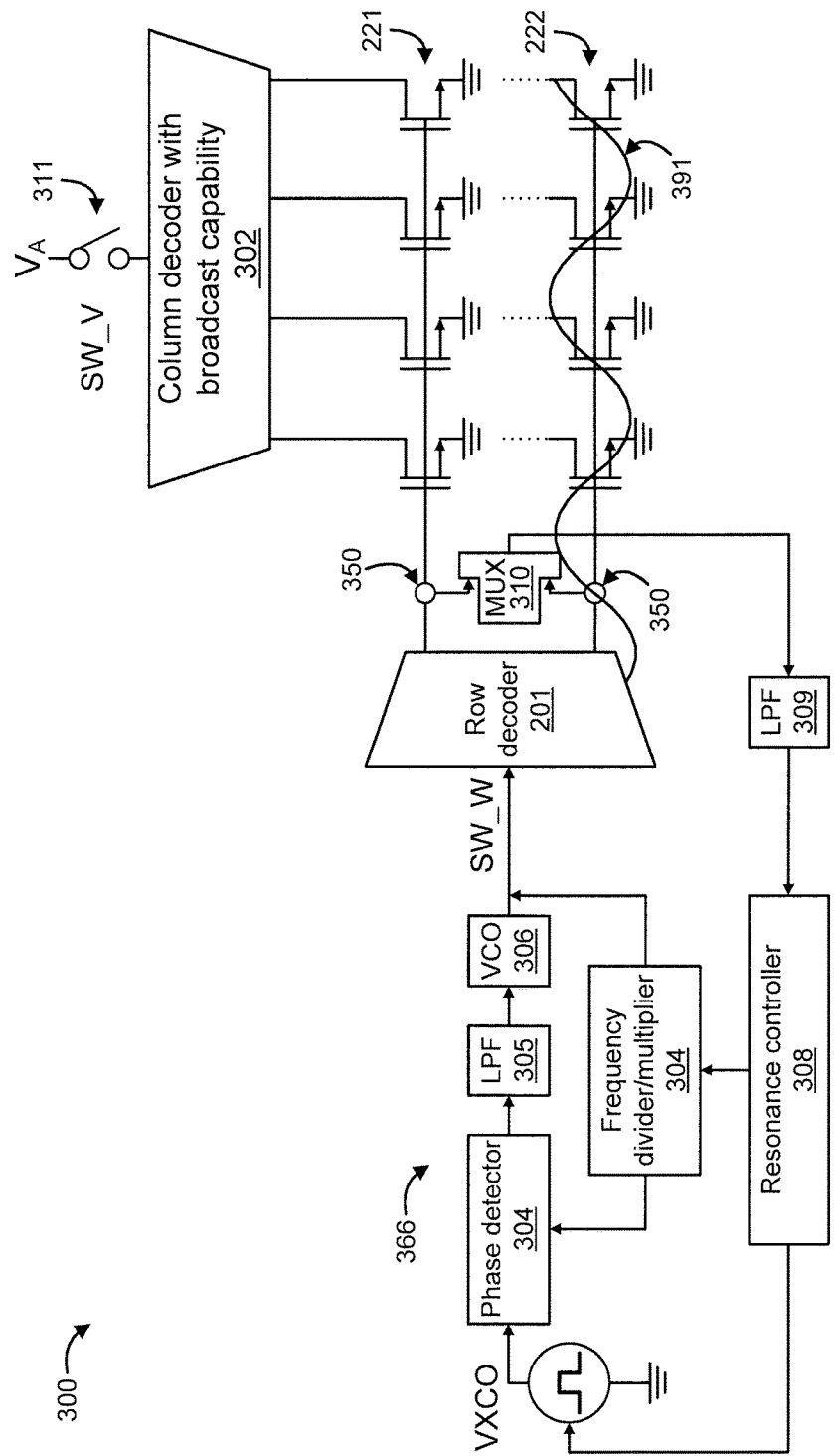
FIG. 3 shows a memory device to which the present invention can be applied, in a resonance calibration mode, in accordance with an embodiment of the present invention.

FIG. 3 shows a memory device 300 to which the present invention can be applied, in a resonance calibration mode, in accordance with an embodiment of the present invention.

In the resonance calibration mode, the memory device 300 involves a row decoder 201, a column decoder with broadcast capability 302, a first row of N-channel enhancement mode Field Effect Transistors (MOSFETs) 221, a second row of N-channel enhancement mode MOSFETs 222, a voltage-controlled crystal oscillator VXCO 303, a phase detector 304, a Low Pass Filter (LPF) 305, a Voltage Controlled Oscillator (VCO) 306, a frequency divider/multiplier 307, a resonance controller 308, a Low Pass Filter (LPF) 309, a multiplexer 310, a switch SW_V 311, and a resonance detection point 350 (at each row decoder end of each word line, that is, the end of each word line closest to the row decoder). The memory device 300 further involves word lines 231 and bit lines 232. The word lines 231 are connected to gates of the MOSFETs 221 and 222, and the bit lines are connected to the drains of the MOSFETs 221 and 222.

It is to be appreciated that the phase detector 304, the LPF 305, and the VCO 306 can be considered to form a Phase Locked Loop (PLL) circuit 366, such that the phase of the output of the VCO 306 is related to the phase of the input to the phase detector 304.

In the resonance calibration mode, the resonance controller 308 is used to control the frequency (by controlling the frequency divider/multiplier 307) so as to minimize the voltage at the resonance detection point 350 (which is modified by the standing wave 391). To that end, the VXCO driving voltage and frequency divider/multiplier values for each word are memorized.

In an embodiment, the row decoder 201 can be configured to drive one or more word lines in parallel.

Figure 4:
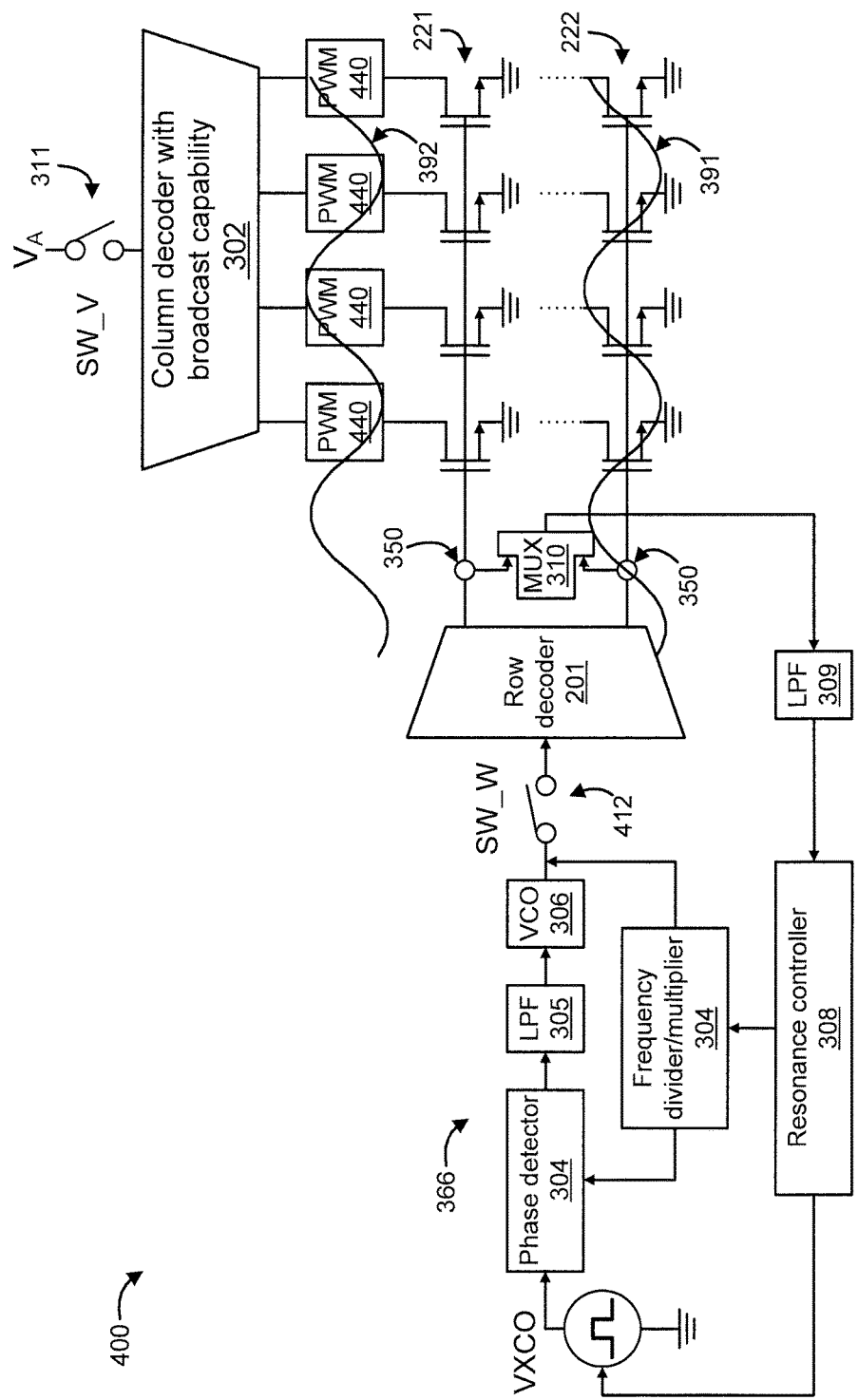
FIG. 4 shows a memory device to which the present invention can be applied, in a cell initialization mode, in accordance with an embodiment of the present invention.

FIG. 4 shows a memory device 400 to which the present invention can be applied, in a cell initialization mode, in accordance with an embodiment of the present invention.

In the cell initialization mode, the memory device 400 involves a row decoder 201, a column decoder with broadcast capability 302, a first row of N-channel enhancement mode Field Effect Transistors (MOSFETs) 221, a second row of N-channel enhancement mode MOSFETs 222, a voltage-controlled crystal oscillator VXCO 303, a phase detector 304, a Low Pass Filter (LPF) 305, a Voltage Controlled Oscillator (VCO) 306, a frequency divider/multiplier 307, a resonance controller 308, a Low Pass Filter (LPF) 309, a multiplexer 310, a switch SW_V 311, a switch SW_W 412, a set of Pulse Width Modulators (PWMs) 440, and a resonance detection point 350 (at each row decoder end of each word line, that is, the end of each word line closest to the row decoder). The memory device 300 further involves word lines 231 and bit lines 232.

In an embodiment, the row decoder 201 can be configured to drive one or more word lines in parallel.

The set of Pulse Width Modulators (PWMs) 440 are connected to the column decoder 302 to further randomize the writing current.

In the cell initialization mode, the standing waves 391 and 392 (generated by the PLL 366) are used, in conjunction with the set of PWMs 440 to initialize each of memory cells (represented by the sets of MOSFETs 221 and 222) with different values.

Figure 5:
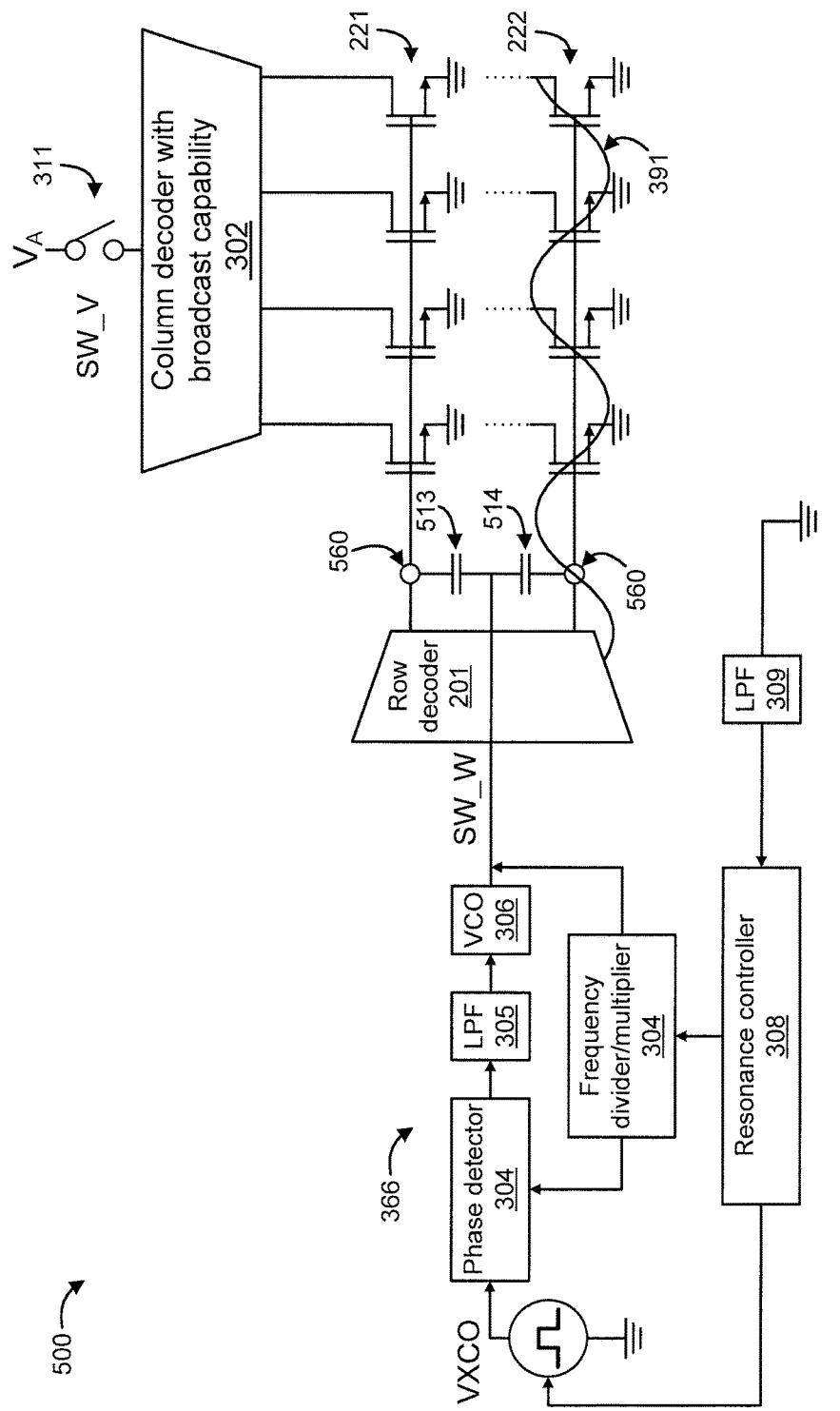
FIG. 5 shows a memory device to which the present invention can be applied, in a random offset mode, in accordance with an embodiment of the present invention.

FIG. 5 shows a memory device 500 to which the present invention can be applied, in a random offset mode, in accordance with an embodiment of the present invention.

In the random offset mode, the memory device 500 involves a row decoder 201, a column decoder with broadcast capability 302, a first row of N-channel enhancement mode Field Effect Transistors (MOSFETs) 221, a second row of N-channel enhancement mode MOSFETs 222, a voltage-controlled crystal oscillator VXCO 303, a phase detector 304, a Low Pass Filter (LPF) 305, a Voltage Controlled Oscillator (VCO) 306, a frequency divider/multiplier 307, a resonance controller 308, a Low Pass Filter (LPF) 309, a switch SW_V 311, a capacitor 513, a capacitor 514, and a wave driving point 560. The memory device 300 further involves word lines 231 and bit lines 232.

In the random offset mode, the standing waves 391 and 392 (generated by the PLL 366) are used to initialize each of memory cells (represented by the sets of MOSFETs 221 and 222) with a random offset.

Figure 6:
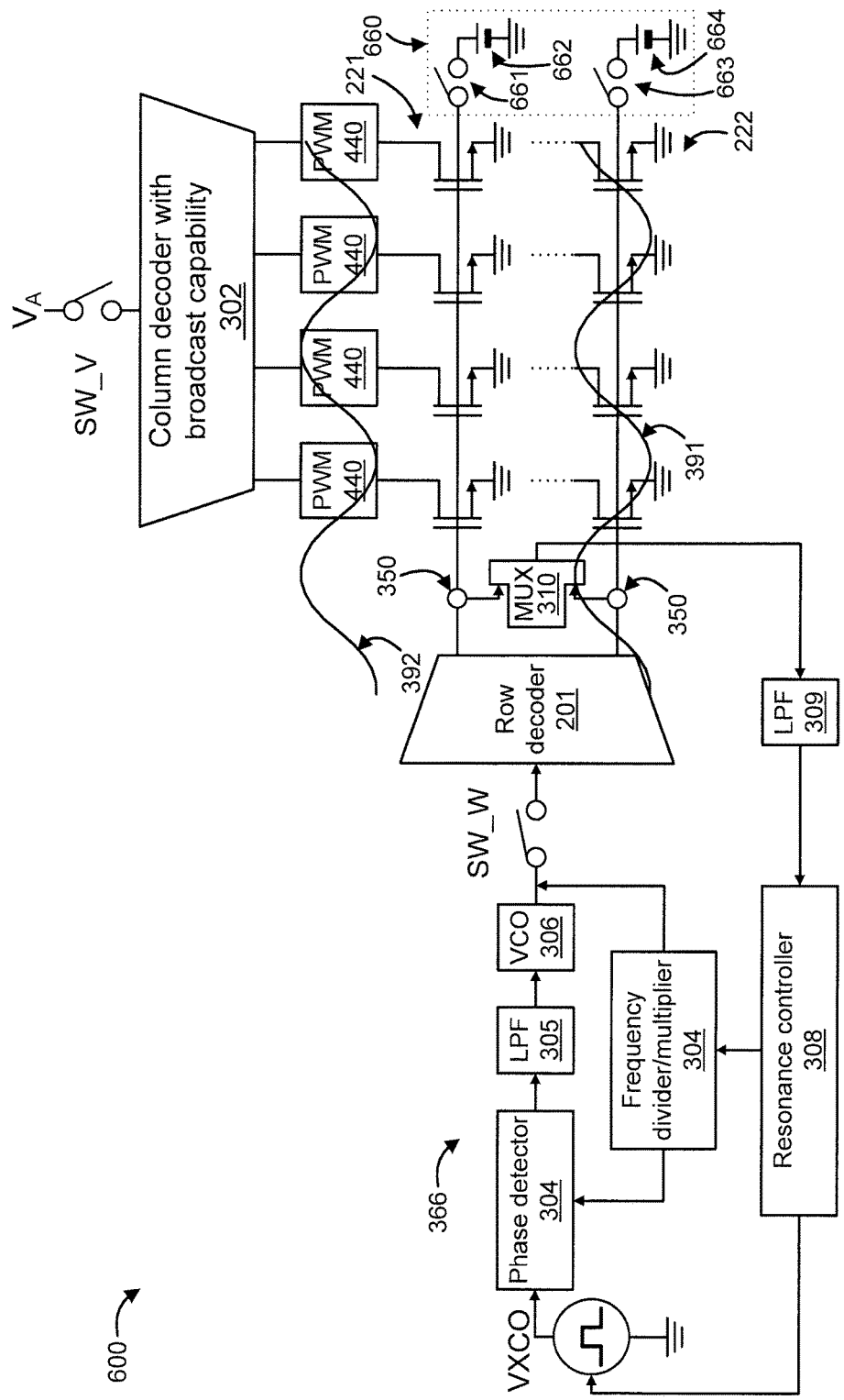
FIG. 6 shows a memory device to which the present invention can be applied, using a bias generator, in accordance with an embodiment of the present invention.

FIG. 6 shows a memory device 600 to which the present invention can be applied, using a bias generator, in accordance with an embodiment of the present invention.

The memory device 600 involves a row decoder 201, a column decoder with broadcast capability 302, a first row of Field Effect Transistors (MOSFETs) 221, a second row of MOSFETs 222, a voltage-controlled crystal oscillator VXCO 303, a phase detector 304, a Low Pass Filter (LPF) 305, a Voltage Controlled Oscillator (VCO) 306, a frequency divider/multiplier 307, a resonance controller 308, a Low Pass Filter (LPF) 309, a multiplexer 310, a switch SW_V 311, a switch SW_W 412, a set of Pulse Width Modulators (PWMs) 440, a resonance detection point 350 (at each row decoder end of each word line, that is, the end of each word line closest to the row decoder), a bias generator 660. The bias generator 660 includes a switch 661, a bias element 662, a switch 663, and a bias element 664. The bias elements can be a cell(s), a capacitor(s), a transistor(s), and so forth. The memory device 300 further involves word lines 231 and bit lines 232.

The bias generator 660 adds a bias to the word lines 231 such that the nodes connected thereto can have a non-zero voltage.

Figure 7:
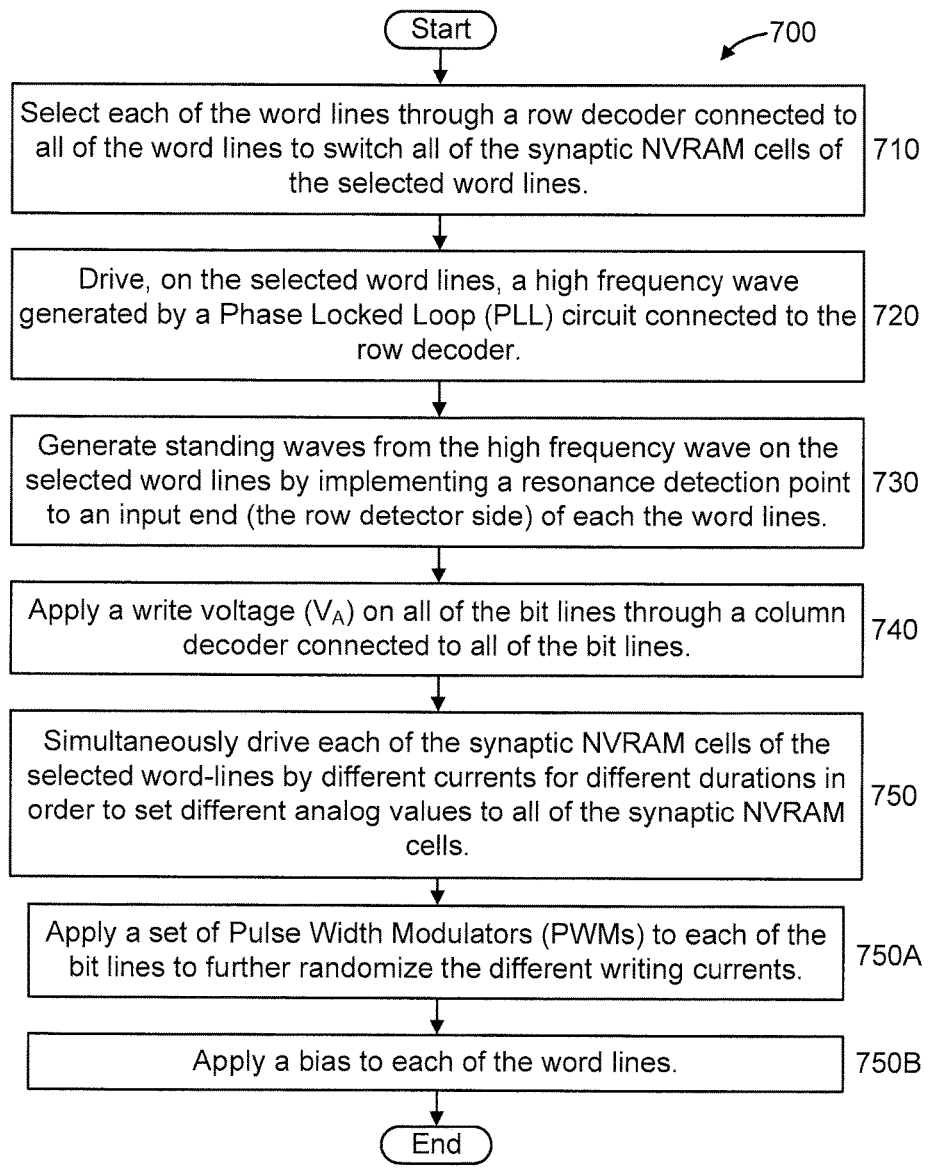
FIG. 7 shows an exemplary method for memory data randomization, in accordance with an embodiment of the present invention.

FIG. 7 shows an exemplary method 700 for memory data randomization, in accordance with an embodiment of the present invention.

At step 710, select each of the word lines through a row decoder connected to all of the word lines to switch all of the synaptic NVRAM cells of the selected word lines.

At step 720, drive, on the selected word lines, a high frequency wave (e.g., up to 100 GHz, although other (e.g., higher values can also be used) generated by a Phase Locked Loop (PLL) circuit connected to the row decoder.

At step 730, generate standing waves from the high frequency wave on the selected word lines by implementing a resonance detection point to an input end (the row detector side) of each the word lines.

At step 740, apply a write voltage ($V_A$) on all of the bit lines through a column decoder connected to all of the bit lines.

At step 750, simultaneously drive each of the synaptic NVRAM cells of the selected word-lines by different writing currents for different durations in order to set different analog values to all of the synaptic NVRAM cells.

In an embodiment, step 750 can include one or more of steps 750A and 750B.

At step 750A, apply a set of Pulse Width Modulators (PWMs) to each of the bit lines to further randomize the different writing currents.

At step 750, apply a bias to each of the word lines. In this way, the node can have a non-zero voltage.

Figure 8:
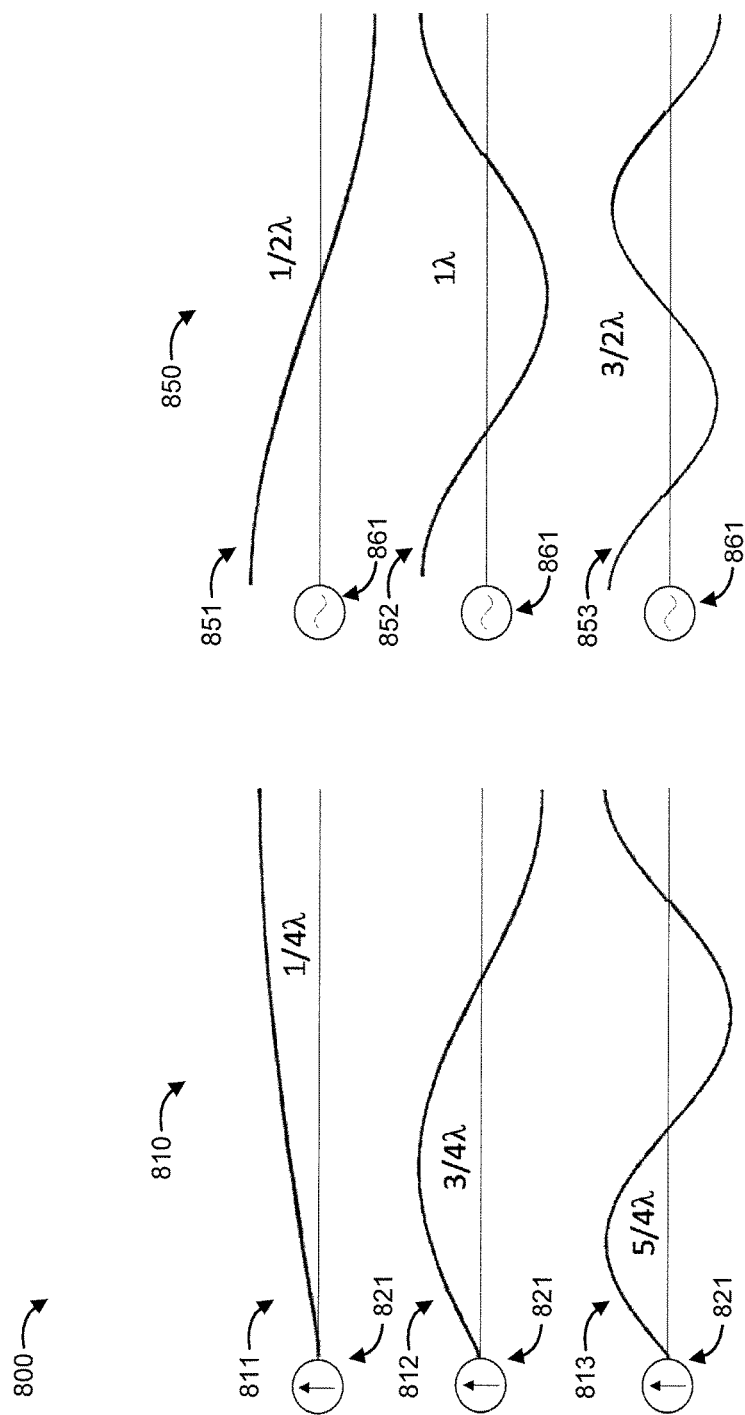
FIG. 8 shows various resonance modes, in accordance with an embodiment of the present invention.

FIG. 8 shows various resonance modes 800, in accordance with an embodiment of the present invention.

The resonance modes 800 include resonance modes 810 involving a low impedance driver 821 and resonance modes 850 involving a high impedance driver 861.

Regarding the various resonance modes 800 are based on an assumption of a 2 mm word line and a relative dielectric constant of 3.

The lowest resonance frequency is $300 \div 2 \div 4 \div \sqrt{3} = 21$ GHz.

The resonance modes 810 involving the low impedance driver 821 include a ¼ λ resonance mode 811, a ¾λ resonance mode 812, and a 5/4λ resonance mode 813. As is known, the symbol "λ" denotes wavelength.

The resonance modes 850 involving the high impedance driver 861 include a ½λ resonance mode 851, a 1λ resonance mode 852, and a 3/2λ resonance mode 853.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of initializing a chip having synaptic Non-Volatile Random Access Memory (NVRAM) cells connected row-wise by word lines and column-wise by bit lines, the method comprising:
   selecting each of the word lines through a row decoder connected to all of the word lines to switch all of the synaptic NVRAM cells of the selected word lines;
   driving, on the selected word lines, a wave generated by a Phase Locked Loop (PLL) circuit connected to the row decoder;
   generating standing waves from the wave on the selected word lines by implementing a resonance detection point at an input end of each the word lines;
   applying a write voltage on all of the bit lines through a column decoder connected to all of the bit lines; and
   simultaneously driving each of the synaptic NVRAM cells of the selected word lines by different writing currents for different durations in order to set different analog values to all of the synaptic NVRAM cells.

2. The method of claim 1, wherein the chip is a neuromorphic chip.

3. The method of claim 2, wherein the NVRAM cells of the neuromorphic chip are configured to form a synaptic cell array.

4. The method of claim 1, wherein applying a write voltage comprises closing a switch connecting the column decoder to the write voltage.

5. The method of claim 1, further comprising using a respective set of capacitors at the input end of the word lines to provide a random offset to the different analog values on the selected word-lines.

6. The method of claim 1, wherein each of the word lines comprise the input end and an output end, the input end being closest to the row decoder, and the output end being farthest from the row decoder.

7. The method of claim 1, further comprising applying a set of Pulse Width Modulators (PWMs) to the bit lines to further randomize the different writing currents.

8. The method of claim 1, further comprising inputting detected resonance on the resonance detection point on each of the selected word lines to a multiplexer for selectively providing a control signal to the PLL.

9. The method of claim 1, wherein the wave is driven by the PLL on multiple ones of the selected word lines in parallel.

10. The method of claim 1, further comprising adding a bias to the selected word lines.

11. A system for initializing a chip having synaptic Non-Volatile Random Access Memory (NVRAM) cells connected row-wise by word lines and column-wise by bit lines, the system comprising:
    a column decoder connected to all of the bit lines;
    a row decoder, connected to all of the word lines, for selecting each of the word lines to switch all of the synaptic NVRAM cells of the selected word lines;
    a Phase Locked Loop (PLL) circuit connected to the row decoder for driving a wave on the selected word lines;
    a resonance detection point implemented at an input end of each the word lines to generate standing waves from the wave on the selected word lines; and
    a switch for applying a write voltage on all of the bit lines through the column decoder,
    wherein each of the synaptic NVRAM cells of the selected word lines is simultaneously driven by different writing currents for different durations in order to set different analog values to all of the synaptic NVRAM cells.

* * * * *